(12) United States Patent
Lee et al.

(10) Patent No.: US 8,035,194 B2
(45) Date of Patent: Oct. 11, 2011

(54) SEMICONDUCTOR DEVICE AND SEMICONDUCTOR PACKAGE INCLUDING THE SAME

(75) Inventors: Jun-Ho Lee, Gyeonggi-do (KR); Hyung-Dong Lee, Gyeonggi-do (KR); Hyun-Seok Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 290 days.

(21) Appl. No.: 12/347,365

(22) Filed: Dec. 31, 2008

(65) Prior Publication Data

US 2010/0164084 A1 Jul. 1, 2010

(30) Foreign Application Priority Data

Dec. 26, 2008 (KR) .................. 10-2008-0134579

(51) Int. Cl.
*H01L 29/417* (2006.01)
*H01L 23/04* (2006.01)
*H01L 23/50* (2006.01)

(52) U.S. Cl. ........ 257/532; 257/621; 257/686; 257/698; 257/E23.067; 257/E23.174

(58) Field of Classification Search .................. 257/621, 257/686, 532, 698, E23.067, E23.174
See application file for complete search history.

(56) References Cited

U.S. PATENT DOCUMENTS

| 3,538,571 A | * | 11/1970 | Stark et al. | 29/25.41 |
| 6,222,260 B1 | * | 4/2001 | Liang et al. | 257/691 |
| 6,313,998 B1 | * | 11/2001 | Kledzik et al. | 361/767 |
| 6,335,566 B1 | * | 1/2002 | Hirashima et al. | 257/686 |
| 6,507,115 B1 | * | 1/2003 | Hofstee et al. | 257/777 |
| 6,873,036 B2 | * | 3/2005 | Akram | 257/686 |

FOREIGN PATENT DOCUMENTS

| KR | 1020060019037 | | 3/2006 |
| KR | 1020060115284 | | 11/2006 |
| KR | 1020070104211 | A | 10/2007 |
| KR | 1020080097329 | | 11/2008 |

OTHER PUBLICATIONS

Notice of Preliminary Rejection issued from Korean Intellectual Property Office on Sep. 30, 2010.
Notice of Allowance issued from Korean Intellectual Property Office on Feb. 28, 2011.

* cited by examiner

*Primary Examiner* — Evan Pert
(74) *Attorney, Agent, or Firm* — IP & T Group LLP

(57) ABSTRACT

Provided is a semiconductor device capable of removing a power ground grid noise using a small area. The semiconductor device includes a first chip including at least one decoupling capacitor; and a second semiconductor chip stacked over the first semiconductor chip, including internal circuits.

15 Claims, 3 Drawing Sheets

SEMICONDUCTOR DEVICE AND SEMICONDUCTOR PACKAGE INCLUDING THE SAME

CROSS-REFERENCE TO RELATED APPLICATIONS

The present invention claims priority of Korean patent application number 10-2008-0134579, filed on Dec. 26, 2008, which is incorporated by reference in its entirety.

BACKGROUND OF THE INVENTION

The present invention relates to a semiconductor device and a semiconductor package, and more particularly, to a semiconductor device and a semiconductor package having the same, including a decoupling capacitor.

A power ground grid noise may occur in a semiconductor device, when current is consumed abruptly and a plurality of signals are inputted/outputted simultaneously. As an integration degree and an operation speed of the semiconductor device increase, an amount of the power ground grid noise increases. Typically, a decoupling capacitor has been used to remove the power ground grid noise. The decoupling capacitor connects between a region for providing a power voltage (VDD) and a region for providing a ground voltage (VSS) and acts as a power storage tank. The use of the decoupling capacitor can remove the power ground grid noise, thereby stably supplying a power to the semiconductor device.

FIG. 1 is a view illustrating a layout of internal circuits 101 and a decoupling capacitor in a conventional semiconductor device.

As shown in FIG. 1, the internal circuits 101 process signals inputted into the semiconductor device 100. For example, the internal circuits 101 may be a circuit for storing data. The decoupling capacitor is deployed on a region A 103, on which the internal circuits 101 is not arranged.

Since a capacitance of the decoupling capacitor configured generally as a Metal Oxide Semiconductor (MOS) is very small, a plurality of the decoupling capacitors are arranged on the A region 103 to minimize the amount of the power ground grid noise and thus enough capacitance is ensured.

Meanwhile, as aforementioned, as the operation speed of the semiconductor device 100 increases and an amount of the power ground grid noise increases, there is a need to deploy more decoupling capacitors on the region A 103 in order to minimize the power ground grid noise. Accordingly, an increased space for deploying the more decoupling capacitors is necessary on the region A 103 and the increased space causes to limit an area of the semiconductor device.

Additionally, since the decoupling capacitor has to be arranged on the region A 103, on which the internal circuits 101 are not arranged, the space for deploying the decoupling capacitor is limited.

SUMMARY OF THE INVENTION

Exemplary embodiments of the present invention are directed to provide a semiconductor device and a semiconductor package including the same capable of removing efficiently a power ground grid noise by ensuring much capacitance of the decoupling capacitor without increasing the area for deploying the decoupling capacitor.

In accordance with one aspect of the present invention, there is provided a semiconductor device, comprising: a first chip including at least one decoupling capacitor; and a second chip stacked over the first chip, including internal circuits.

In accordance with another aspect of the present invention, there is a semiconductor package, comprising: a wire board; a first chip stacked over the wire board, including at least one decoupling capacitor; and a second chip stacked over the first chip, including internal circuits.

According to the present invention, much capacitance of the decoupling capacitor can be endured by providing the decoupling capacitor formed on a separate semiconductor chip without increasing the area thereof, thereby removing efficiently the power ground grid noise.

Additionally, according to the present invention, a decoupling capacitance of the decoupling capacitor can be endured easily by providing the decoupling capacitor formed on a separate semiconductor chip without performing minute processes, thereby removing efficiently the power ground grid noise.

Finally, according to the present invention, a decoupling capacitance of the decoupling capacitor can be endured easily by providing the decoupling capacitor formed on a separate semiconductor chip without a space limitation, thereby removing efficiently the power ground grid noise.

DESCRIPTION OF SPECIFIC EMBODIMENTS

Figure 1:
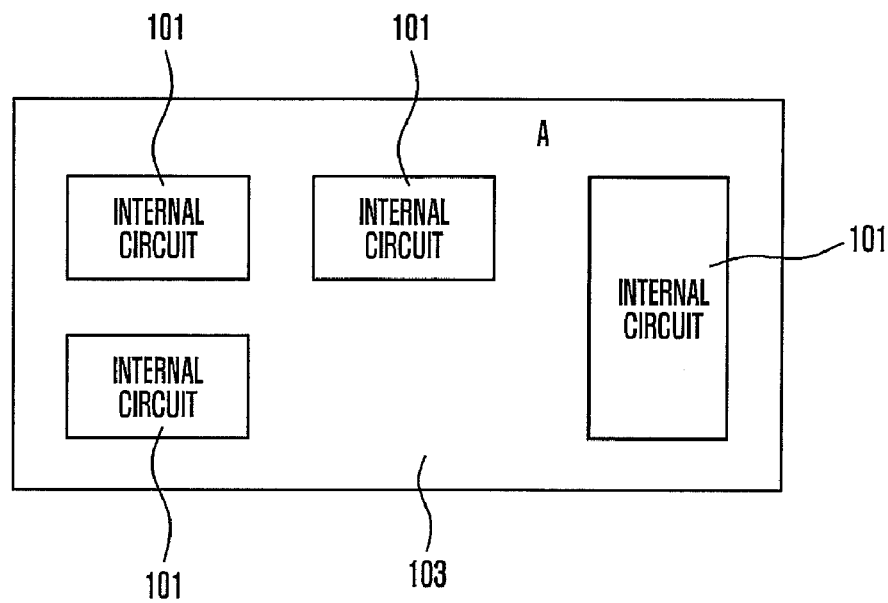
FIG. 1 is a view illustrating a layout of internal circuits 101 and a decoupling capacitor in a conventional semiconductor device 100.

Other objects and advantages of the present invention can be understood by the following description, and become apparent with reference to the embodiments of the present invention. In the figures, the dimensions of layers and regions may be exaggerated for clarity of illustration. Like reference numerals refer to like elements throughout.

Figure 2:
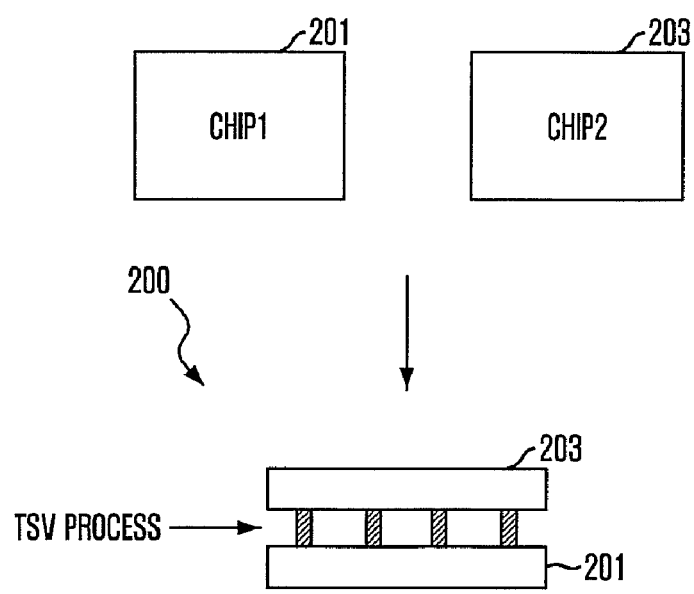
FIG. 2 is a view illustrating a semiconductor device 200 according to an embodiment of the present invention.

FIG. 2 a view illustrating a semiconductor device 200 according to an embodiment of the present invention.

Referring FIG. 2, the semiconductor device 200 includes a first semiconductor chip 201 and a second semiconductor chip 203. The second semiconductor chip 203 is stacked over the first semiconductor chip 201.

The first semiconductor chip 201 includes at least one capacitor. The second semiconductor chip 203 includes internal circuits for processing inputted signals. The capacitor of the first semiconductor chip 201 may be a decoupling capacitor for removing the power ground rid noise.

Differently from the conventional semiconductor device 100 shown in FIG. 1, the decoupling capacitor is deployed not on the second semiconductor chip 203 with the internal circuits, but on the first semiconductor chip 201. The first semiconductor chip 201 is connected electrically to the second semiconductor chip 203. The first and second semiconductor chips 201 and 203 may be connected electrically with each other through a connector. The connector is formed by a Through Silicon Via (TSV) process. More detailed connection configuration of the first and second semiconductor chips 201 and 203 will be described later.

Accordingly, since the second semiconductor chip 203 does not include the decoupling capacitor, the area of the second semiconductor chip 203 can be decreased as much as the area of the decoupling capacitor. Also, the overall area of the semiconductor device 200 can be decreased. In addition, since the decoupling capacitor is formed on the first semiconductor chip 201 regardless of a deployment of the internal circuits, the deployment of the decoupling capacitor is made easily without a space limitation.

Additionally, since the decoupling capacitor is formed on the first semiconductor chip 201 on which the internal circuits are not arranged and thus have enough space, minute processes for fabricating the decoupling capacitor are not necessary. Therefore, the decoupling capacitor can be fabricated easily.

Meanwhile, the capacitors included on the first semiconductor chip 201 may be used to perform various functions depending on the second semiconductor chip 203. For example, when the second semiconductor chip 203 is a DRAM chip and includes a boosted voltage VPP generating circuit applied to word lines, the capacitor included on the first semiconductor chip 201 may be used in generating the boosted voltage VPP.

Figure 3:
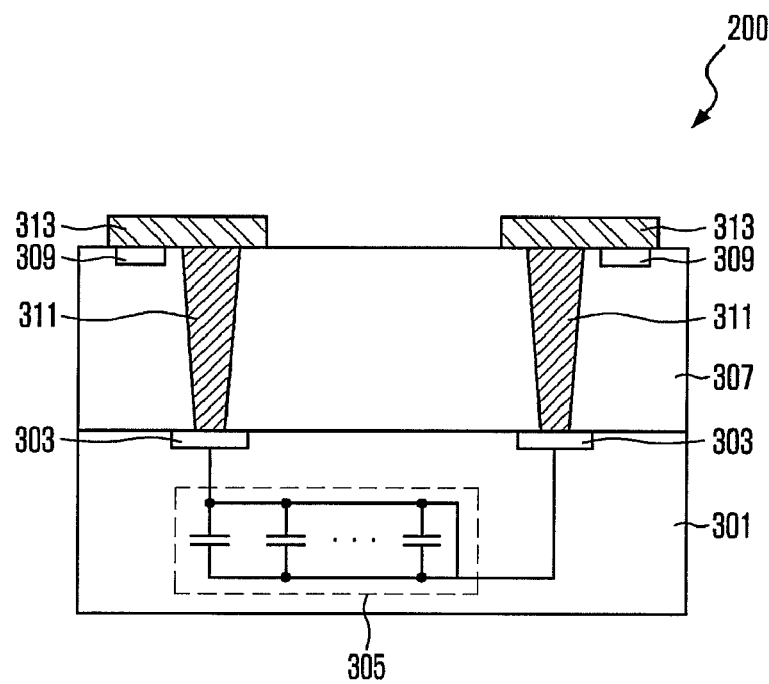
FIG. 3 is a cross-sectional view illustrating an embodiment of the semiconductor device 200 shown in FIG. 2.

FIG. 3 a cross-sectional view illustrating an embodiment of the semiconductor device 200 shown in FIG. 2.

Referring FIG. 3, a first semiconductor chip 310 and a second semiconductor chip 307 include a first pad 303 and a second pad 309, respectively. Even though the first and second pads 303 and 309 are only illustrated in cross-sections thereof in FIG. 3, the first and second semiconductor chips 301 and 307 each include a plurality of pads. Here, the first and second pads 303 and 309 may be a power pad or a ground pad.

A decoupling capacitor 305 included on the first semiconductor chip 301 is connected electrically with the first pad 303. In more detailed description thereof, on one end of the decoupling capacitor 305 is connected electrically with a power pad and the other end thereof is connected electrically with a ground pad. FIG. 3 illustrates schematically the decoupling capacitor 305 and detailed configuration thereof will be described referring to FIG. 4.

A via 311 formed inside the second semiconductor chip 307 connects electrically the second pad 309 with the first pad 303 and thus the first and second semiconductor chips 301 and 307 are connected electrically. In more detailed description thereof, the via 311 connects electrically the power pads of the first and second semiconductor chips 301 and 307 and the ground pads of the first and second semiconductor chips 301 and 307, depending on the pads connected with the decoupling capacitor 305.

The via 311 may be formed through a Through Silicon Via (TSV) fabricating process. A metal layer 314 connects electrically the via 313 and the second pad 309. The via 311 may be formed directly on a region of the second pad 309. The via 311 may be connected electrically with the second pad 309 without a separate metal layer. The internal of the via 311 is filled with a conductive material to connect electrically the first pad 303 and the second pad 309.

Figure 4:
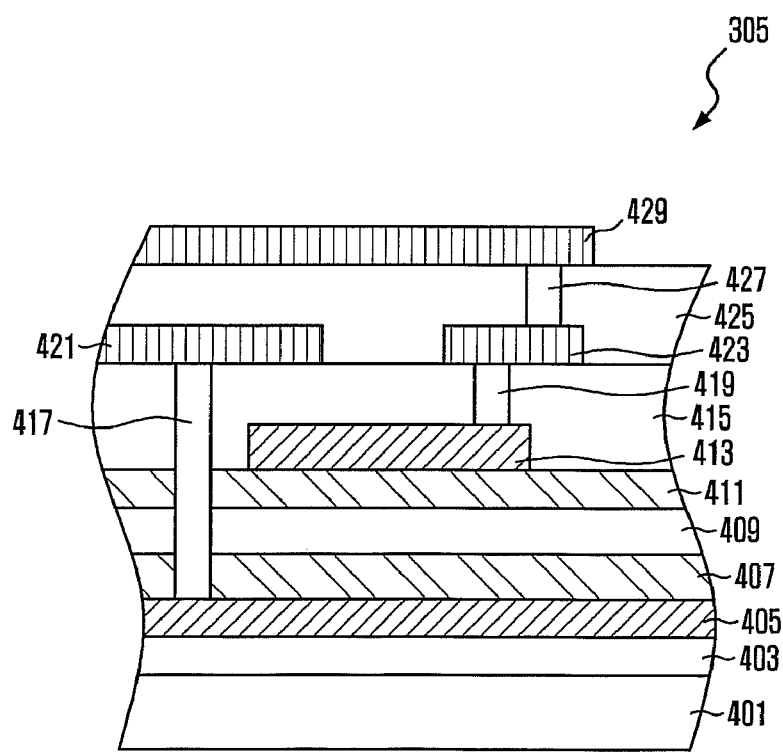
FIG. 4 is a view illustrating a configuration of a capacitor 305 of a first semiconductor chip 301 shown in FIG. 3.

FIG. 4 is a view illustrating an embodiment of a configuration of a capacitor 305 of a first semiconductor chip 301 shown in FIG. 3.

The configuration shown in FIG. 4 is illustrative of the capacitor 305 of the first semiconductor chip 301. The capacitor 305 of the first semiconductor chip 301 may include all capacitors fabricated through a wafer manufacturing process.

Referring FIG. 4, an oxide layer 403 is formed on a silicon substrate 401 and a poly silicon layer 405 is deposited on the oxide layer 403. After that, an oxide layer 407, a nitride layer 409 and an oxide layer 411 are deposited over the poly silicon layer 405, subsequently, and then a poly silicon layer 413 is deposited on the oxide layer 411. Accordingly, two poly silicon layers 405 and 413 act as conductive layers and the oxide layer, nitride layer, and oxide layer 407, 409, and 411 interposed there-between act as dielectric layers to form a capacitor. A poly silicon layer 401 may be connected with a ground pad and a poly silicon layer 413 may be connected with a power pad.

Subsequently, an inter-layer insulation layer 415 is applied over the poly silicon layer 413 and the oxide layer 411 and vias 417 and 419 are formed for the poly silicon layers 401 and 413 to be connected with the ground pad and the power pad, respectively. In the next, metal layers 421 and 423 are deposited over the inter-layer insulation layer 415 to connect with the vias 417 and 419 and then an inter-layer insulation layer 425 is applied. Additionally, a via 427 is formed through the inter-layer insulation layer 425 to connect the metal layers 423 and 429.

Figure 5:
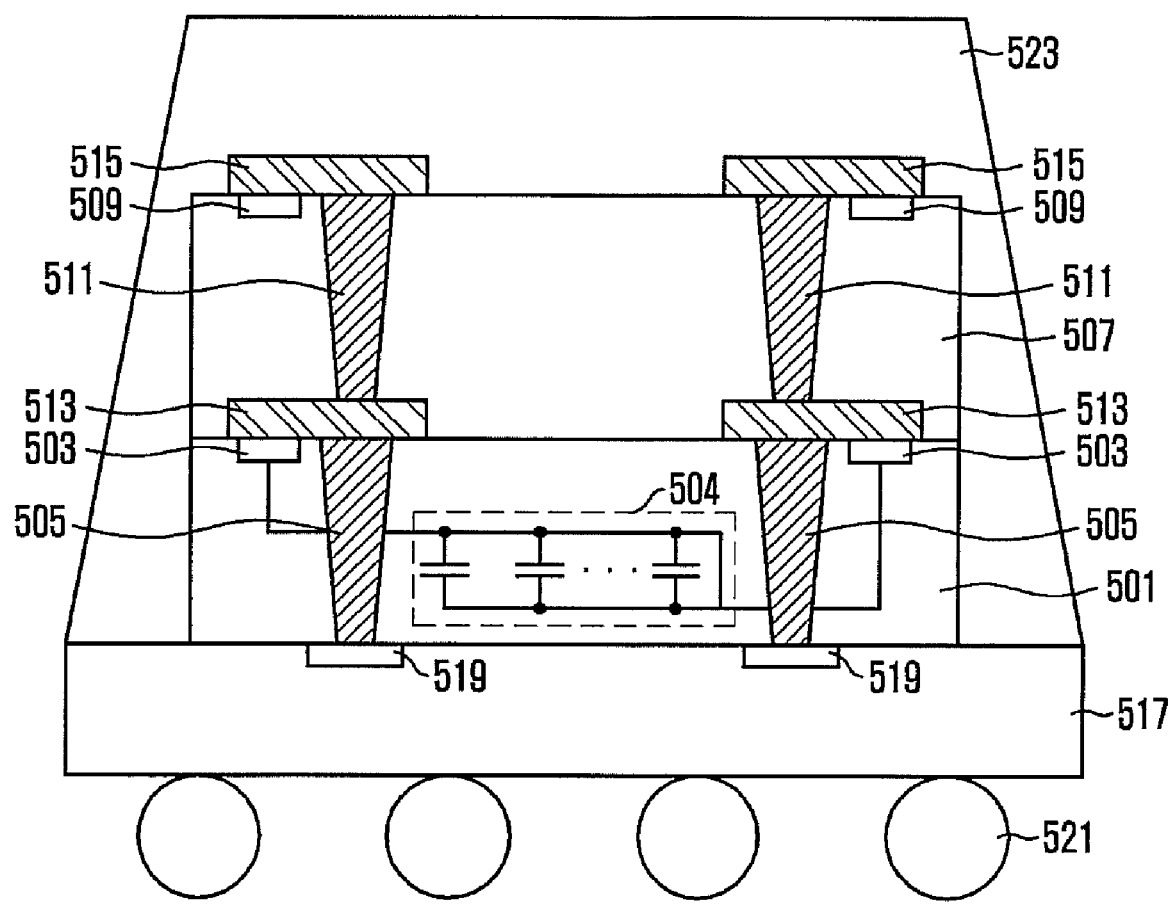
FIG. 5 is a cross-sectional view illustrating a semiconductor package according to an embodiment of the present invention.

FIG. 5 is a cross-sectional view illustrating a semiconductor package according to an embodiment of the present invention.

Referring FIG. 5, the semiconductor package includes a wire board 517 and first and second semiconductor chips 501 and 507.

The semiconductor package includes the semiconductor device 200 as shown in FIG. 3.

The first and second semiconductor chips 501 and 507 of the semiconductor package shown in FIG. 5 correspond to the first and second semiconductor chips 301 and 307 of the semiconductor device shown in FIG. 3, respectively. However, the semiconductor chip 501 may further include the via 505 formed there-through and the via 505 connects electrically the wire board 517 and the second semiconductor chip 507. The via 505 may be formed through the TSV process.

The semiconductor package according to the present invention will be described in detail hereinafter.

The wire board 517 refers to a multi layer printed circuit board on which multi layers of metal wire are formed, and includes a third pad 519 for connecting between the first and second semiconductor chips 501 and 507 and solder balls 521 for connecting with external elements. The solder ball 521 acts as an external connection terminal. The third pad 519 and the solder ball 521 are connected with the metal wires of the wire board 517. Meanwhile, the first to third pads 503, 509, and 519 may be power pads or ground pads.

The first semiconductor chip 501 includes a capacitor 504 and the via 505 of the first semiconductor chip 501 connects electrically the third pad 519 with the via 511 of the second semiconductor chip 507 and thus connects electrically the wire board 517 with the second semiconductor chip 507. That is, the via 505 of the first semiconductor chip 501 connects electrically the power pad and the ground pad of the wire board 517 with the power pad and the ground pad of the first semiconductor chip 501. The via 511 of the second semiconductor chip 507 connects electrically the power pad and the ground pad of the first semiconductor chip 501 with the power pad and the ground pad of the second semiconductor chip 507.

The vias 503 and 511 of the first and second semiconductor chips 501 and 507 may be connected with the first and second pads 503 and 509 respectively, without the metal layers 513 and 515.

An encapsulation body 523 may be formed of resin and protects the first and second semiconductor chips 501 and 507 from a mechanical or electrical impact.

Meanwhile, even though FIG. 1 illustrates an embodiment of the wire board 517 being a printed circuit board; however, a tape board and silicon board, etc. may be used as the wire board 517. In addition, the semiconductor package according to the present invention may connect electrically the second semiconductor chip 507 with the wire board using a bonding wire without forming the via 505 through the first semiconductor chip 501.

The semiconductor package according to the present invention may include more than one semiconductor chip stacked over the second semiconductor chip 507 wherein the semiconductor chip stacked over the second semiconductor chip 507 is connected electrically with other semiconductor chips stacked there-below and includes a via formed there-through.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
a first chip including at least one decoupling capacitor;
a second chip stacked over the first chip, including internal circuits; and
a connector formed through the second chip, connecting the first chip and the second chip,
wherein the first chip and the second chip are formed on different wafers, and the connector is a via formed by a Through Silicon Via (TSV) process.

2. The semiconductor device of claim 1, wherein one end of the decoupling capacitor is connected to a power pad and the other end of the decoupling capacitor is connected to a ground pad.

3. The semiconductor device of claim 1, wherein the connector connects a power pad of the first chip and that of the second chip.

4. The semiconductor device of claim 1 wherein the connector connects a ground pad of the first chip and that of the second chip.

5. A semiconductor package, comprising:
a wire board;
a first chip stacked over the wire board, including at least one decoupling capacitor;
a second chip stacked over the first chip, including internal circuits; and
a second connector formed through the second chip, connecting the first chip and the second chip,
wherein the first chip and the second chip are formed on different wafers, and the second connector is a via formed by a Through Silicon Via (TSV) process.

6. The semiconductor package of claim 5, wherein one end of the decoupling capacitor is connected to a power pad and the other end of the decoupling capacitor is connected to a ground pad.

7. The semiconductor package of claim 5, further comprising a first connector formed through the first chip, connecting the wire board and the first chip.

8. The semiconductor package of claim 5, wherein the second connector connects a power pad of the first chip and that of the second chip.

9. The semiconductor package of claim 5, wherein the second connector connects a ground pad of the first chip and that of the second chip.

10. The semiconductor package of claim 5, further comprising an encapsulation body for protecting the first and second chips.

11. A semiconductor device, comprising:
a first chip including at least one decoupling capacitor;
a second chip stacked over the first chip, including internal circuits; and
a connector formed through the second chip, connecting the first chip and the second chip,
wherein the connector is a via formed by a Through Silicon Via (TSV) process.

12. The semiconductor device of claim 11, wherein one end of the decoupling capacitor is connected to a power pad and the other end of the decoupling capacitor is connected to a ground pad.

13. A semiconductor package, comprising:
a wire board;
a first chip stacked over the wire board, including at least one decoupling capacitor;
a second chip stacked over the first chip, including internal circuits; and
a second connector formed through the second chip, connecting the first chip and the second chip,
wherein the second connector is a via formed by a Through Silicon Via (TSV) process.

14. The semiconductor package of claim 13, wherein one end of the decoupling capacitor is connected to a power pad and the other end of the decoupling capacitor is connected to a ground pad.

15. The semiconductor package of claim 13, further comprising a first connector formed through the first chip, connecting the wire board and the first chip.

* * * * *